United States Patent [19]

Roberts et al.

[11] Patent Number: 4,575,683

[45] Date of Patent: Mar. 11, 1986

[54] APPARATUS AND METHOD FOR REMOVING AN OFFSET SIGNAL

[75] Inventors: Richard D. Roberts, Palm Bay; Robert S. Padgett, Melbourne, both of Fla.

[73] Assignee: Harris Corporation, Melbourne, Fla.

[21] Appl. No.: 721,824

[22] Filed: Apr. 10, 1985

[51] Int. Cl.[4] .......................... H03D 3/00; H03D 3/18
[52] U.S. Cl. ....................................... 329/50; 329/122; 375/76; 375/81; 455/214; 307/354
[58] Field of Search ................. 329/50, 104, 110, 122, 329/124; 375/58, 76, 81, 82, 94, 95, 102; 455/63, 214, 312, 337; 307/351, 354, 360, 361, 236; 340/347 CC; 330/9; 364/571

[56] References Cited

U.S. PATENT DOCUMENTS

| | | | |
|---|---|---|---|
| 3,359,410 | 12/1967 | Frisby et al. | 235/183 |
| 3,473,131 | 10/1969 | Perkins, Jr. | 328/163 |
| 4,097,860 | 6/1978 | Araseki et al. | 340/347 |
| 4,186,384 | 1/1980 | Acker | 340/347 |
| 4,193,039 | 3/1980 | Massa et al. | 328/162 |
| 4,229,703 | 10/1980 | Bustin | 328/162 |
| 4,237,424 | 12/1980 | Weiner | 328/175 |
| 4,250,458 | 2/1981 | Richmond et al. | 329/112 |
| 4,363,977 | 12/1982 | Tsuda et al. | 307/358 |
| 4,365,204 | 12/1982 | Haque | 328/127 |
| 4,387,438 | 6/1983 | Lucich et al. | 364/574 |

Primary Examiner—Eugene R. LaRoche
Assistant Examiner—D. C. Mis
Attorney, Agent, or Firm—John L. DeAngelis, Jr.

[57] ABSTRACT

An offset compensator is disclosed. The offset compensator is suitable for use with any antipodal information signal distorted by an offset voltage. The offset compensator measures the positive and negative peak amplitudes, compares the magnitudes thereof, and produces a correction voltage based on that comparison. The correction voltage has a positive sign when the magnitude of the negative peak amplitude exceeds the magnitude of the positive peak amplitude, and the correction voltage has a negative sign when the magnitude of the positive peak amplitude exceeds the magnitude of the negative peak amplitude. The magnitude of the correction voltage represents the difference between the magnitudes of the positive and negative peak amplitudes, and is added to the antipodal information signal to remove the offset voltage.

19 Claims, 9 Drawing Figures

APPARATUS AND METHOD FOR REMOVING AN OFFSET SIGNAL

FIELD OF THE INVENTION

This invention relates generally to a method and apparatus for removing an offset signal from a data signal, and more specifically, to a method and apparatus for removing the offset signal of an antipodal data signal.

BACKGROUND OF THE INVENTION

Digital and analog information signals are frequently distorted by an offset voltage, which effectively moves the signal baseline. When the offset voltage is positive, the positive and negative peaks of the information signal increase in the positive direction; when the offset voltage is negative, the positive and negative peaks of the information signal move in the negative direction. The magnitude of the offset voltage that will cause incorrect interpretation of the information signal depends on the positive and negative amplitudes of the information signal.

An offset voltage has two components, a static component caused by inherent manufacturing tolerances of electronic components, and a dynamic component caused by temperature variations and other distortion-producing effects over time. For proper recovery of the information signal, both of these components must be removed from or nulled out of the information signal. Previous attempts to remove the offset voltage related only to the static component. According to the prior art, the static component is removed manually by the setting of a potentiometer, but no provisions are made for component aging, temperature, or other time-based effects. Thus, the information signal may still be distorted by the dynamic component of the offset voltage.

U.S. Pat. No. 3,473,131, entitled *"Level-Shift Correction Circuits"*, discloses a signal conditioning circuit for maintaining sequential pulses of alternate polarity at the same uniform level relative to a reference level, despite undesired level shifts in some of the received pulses. A pair of signal processing channels store energy representative of the level of an incoming pulse of one polarity in one channel during the interval occupied by that pulse, after which the magnitude of the stored energy is used as a datum against which the energy stored in the other channel during the next interval of an opposite polarity pulse is compared. The channels continually alternate in their roles, and during each pulse interval the difference between the energy stored in each channel is used to derive an error signal proportional to the difference. The error signal is fed back to an input terminal for combining with the input signal and reducing the level shift thereof.

SUMMARY OF THE INVENTION

A method and apparatus for removing an offset voltage from an information signal is disclosed. The present invention overcomes the disadvantages discussed above by performing an initial nulling to remove the static component of the offset voltage, and performing null adjustments during reception of the information signal to remove the dynamic component.

According to the inventive principles, the offset voltage is removed from an antipodal information signal i.e., a signal with equal positive and negative peak magnitudes. When a transition in the information signal is detected, the amplitude peak following that transition is measured. The magnitudes of the positive and negative peak amplitudes are compared and a correction voltage generated based on the comparison. If the offset voltage has caused the information signal to drift in a positive direction, the correction voltage is negative such that when added to the information signal the baseline for the information signal returns to zero. When the offset voltage causes the information signal baseline to drift negative, the correction voltage is positive such that when added to the information signal the baseline returns to zero.

When used in the embodiment of a receiver for demodulating a modulated carrier signal, the nulling is accomplished in two stages. According to the present invention, before the modulated carrier signal is received, the receiver stages are activated, the offset voltage is detected, and the proper correction voltage is produced to null the offset effects. While the modulated carrier signal is being received and demodulated, the offset voltage is detected as discussed above, and the correction voltage is adjusted to compensate for the offset voltage as it changes during signal reception.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF THE PREFERRED EMBODIMENTS

Figure 1:
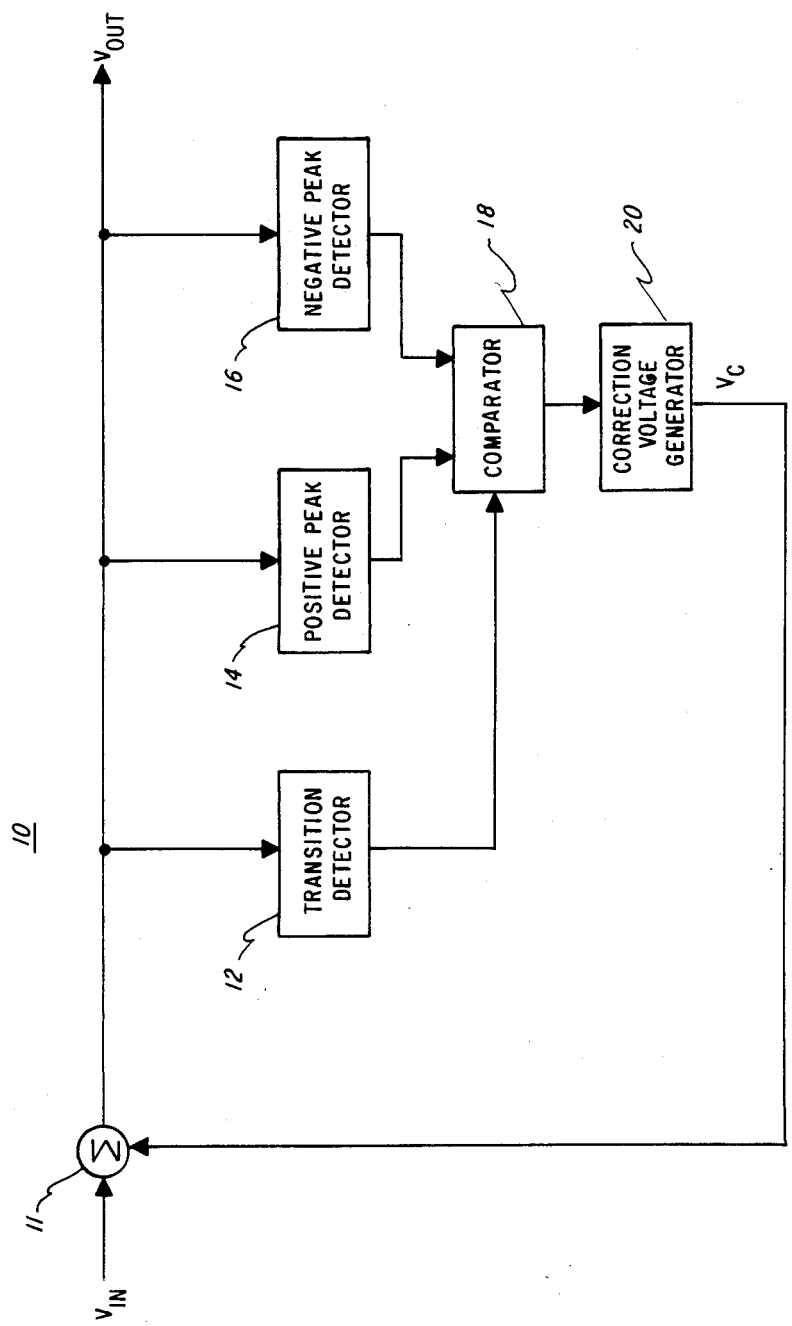
FIG. 1 is a block diagram of an offset compensator constructed according to the teachings of the present invention.

Turning to FIG. 1, there is shown, in block diagram form, an offset compensator 10 constructed according to the teachings of the present invention. In the offset compensator 10, an input information signal, designated $V_{IN}$, is input to a first input terminal of a summer 11. The input information signal $V_{IN}$ is an antipodal signal, that is, a signal that goes positive and negative by equal magnitudes. In one embodiment of the invention $V_{IN}$ is an analog antipodal signal, and in another embodiment $V_{IN}$ is a digital antipodal signal. In either case, $V_{IN}$ is distorted by an offset voltage that moves the baseline thereof away from zero. The resulting distortion of $V_{IN}$ can result in an improper interpretation thereof. An output signal from the summer 11, designated $V_{OUT}$, represents the input information signal $V_{IN}$ with the offset voltage removed. According to the inventive principles the offset voltage is removed by detecting transitions in $V_{OUT}$ and determining the positive and negative peak amplitudes immediately after a transition. The magnitudes of the peak amplitudes are compared, and the result generates a correction $V_C$ voltage that is added to $V_{IN}$ to null or cancel the offset voltage.

According to the inventive principles, transitions in the output signal $V_{OUT}$ are detected in a transition detector 12. The positive and negative peaks of $V_{OUT}$ are detected in a positive peak detector 14, and a negative peak detector 16, respectively. The resultant signals from the transition detector 12, the positive peak detector 14, and the negative peak detector 16, are input to a comparator 18. In the comparator 18, the magnitude of the positive and negative peaks are compared after a transition has been detected. A signal representing the difference between the positive and negative peak amplitudes is input to a correction voltage generator 20 from the comparator 18. The correction voltage generator 20 produces the correction voltage $V_C$ having a magnitude representing the difference between the magnitudes of the positive and negative peak amplitudes, and having a sign opposite the sign of the peak with the greatest magnitude. That is, if the magnitude of the positive peak is greater than the magnitude of the negative peak, the correction voltage represents the difference in magnitudes and has a negative sign. If the magnitude of the negative peak amplitude exceeds the magnitude of the positive peak amplitude, the correction voltage represents the difference in magnitudes and has a positive sign. A second input terminal of the summer 11 is responsive to $V_C$. $V_C$ and $V_{IN}$ are added in the summer 11 to cancel or null the offset voltage. In one embodiment of the present invention, the transition detection 12 operates by detecting zero-crossings in $V_{OUT}$.

Because the correction $V_C$ is derived from the positive and negative peak amplitudes and the positive and negative peak detectors 14 and 16 have a finite charge time the input information signal must have been at the negative or positive value for a time in excess of a predetermined threshold. In one embodiment of the present invention this threshold is approximately 200 microseconds.

Figure 2A:
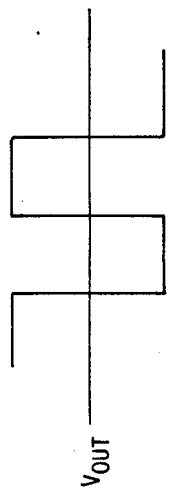
FIGS. 2A and 2B depict a digital signal before and after removal of the offset voltage by the offset compensator of FIG. 1.
Figure 3A:
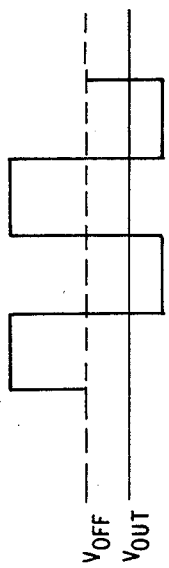
FIGS. 3A and 3B depict an analog signal before and after removal of the offset voltage by the offset compensator of FIG. 1.
Figure 2B:
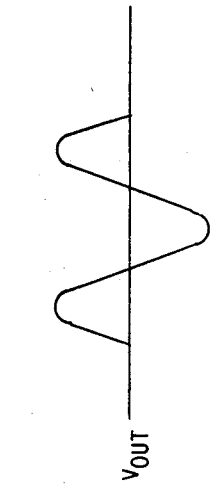
Figure 3B:
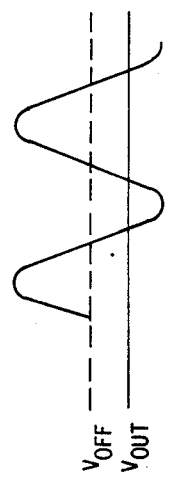

FIG. 2A illustrates a digital antipodal output signal $V_{OUT}$ offset by a dc offset voltage, designated $V_{OFF}$. After correction in the offset compensator 10, the dc offset voltage $V_{OFF}$ is removed as illustrated in FIG. 2B. FIGS. 3A and 3B illustrate the effects of a dc offset voltage and the removal thereof from an antipodal analog signal. In the preferred embodiment, the positive peak detector 14 and the negative peak detector 16 can detect digital or analog peaks. FIGS. 2A, 2B, 3A, and 3B are merely exemplary illustrations showing two types of signals that can be processed by the offset compensator 10 for removal of the offset voltage. The offset compensator 10 can effectively remove offset voltages of a dc or slowly changing ac nature.

Figure 4:
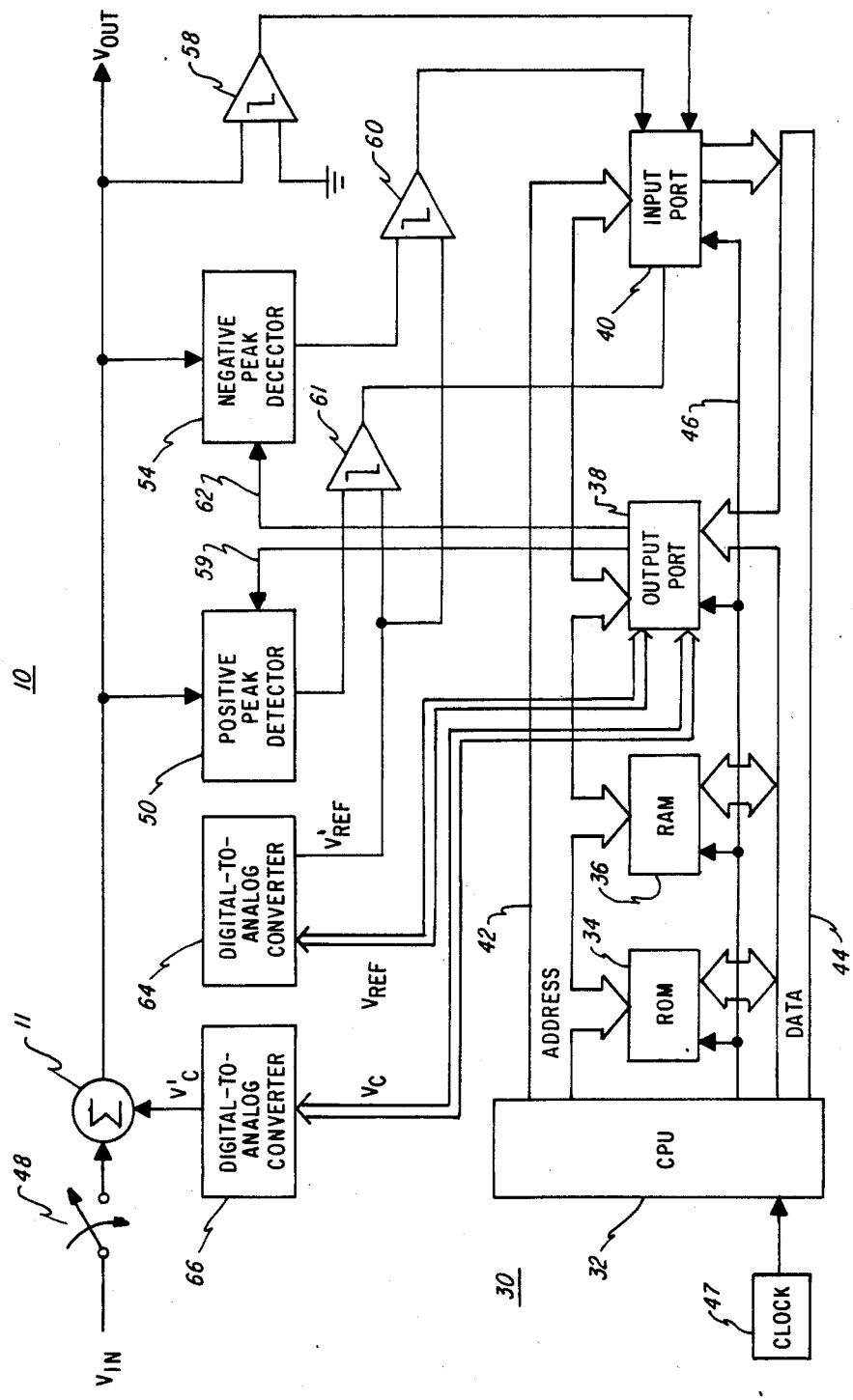
FIG. 4 is a block diagram of a second embodiment of an offset compensator constructed according to the teachings of the present invention.

FIG. 4 illustrates a second embodiment of the offset compensator 10 constructed according to the teachings of the present invention. The embodiment of FIG. 4 includes a microcomputer 30. Specifically, the microcomputer 30 includes a central processing unit (CPU) 32, a read-only memory (ROM) 34, a random-access memory (RAM) 36, an output port 38, and an input port 40. The CPU communicates via the address bus 42 with the ROM 34, the RAM 36, the output port 38, and the input port 40. Through control lines 46, the CPU 32 controls operation of the ROM 34, the RAM 36, the output port 38, and the input port 40. Data is transferred bi-directionally on a data bus 44 connecting the CPU 32, the ROM 34, the RAM 36, the output port 38, and the input port 40. A clock 47 provides appropriate timing signals to the CPU 32.

According to the inventive principles, the input information signal $V_{IN}$ is supplied to the summer 11 via a switch 48. The summer 11 is identical in structure and function to the summer 11 discussed in FIG. 1. A correction voltage $V_C'$ is also supplied as an input to the summer 11 to remove the offset voltage. The summer 11 sums the signals $V_{IN}$ and $V_C'$ to produce the output signal $V_{OUT}$.

According to the inventive principles, a reference signal $V_{REF}$ from the output port 38 is supplied as an input to a digital-to-analog converter 64 for conversion from a digital to an analog value. The analog value, designated $V_{REF}'$ is coupled to a first input terminal of a comparator 60 and a first input terminal of a comparator 61. $V_{OUT}$ is supplied as an input to a positive peak detector 50, for determining the magnitude of the positive peaks of $V_{OUT}$. The positive peak detector 50 is identical in structure and function to the positive peak detector 14 of FIG. 1. A signal from the positive peak detector 50 that represents the magnitude of the positive peaks of $V_{OUT}$ is coupled to a second input terminal of the comparator 61. An output terminal of the comparator 61 is connected to a first input terminal of the input port 40. To determine the magnitude of each positive peak, the microcomputer 30, changes the reference signal $V_{REF}$ until the output signal from the comparator 61 changes state, thereby indicating that the positive peak value of $V_{OUT}$ equals $V_{REF}'$. The corresponding value of $V_{REF}$ is then stored in the RAM 36. The microcomputer 30 employs a successive approximation algorithm to rapidly converge the reference signal to each peak value of $V_{OUT}$.

A negative peak detector 54 is also responsive to $V_{OUT}$ for producing an analog signal representative of the magnitude of the negative peaks of $V_{OUT}$. The negative peak detector 54 is identical in structure and function to the negative peak detector 16 in FIG. 1. A signal from the negative peak detector 54 is fed to a second input terminal of the comparator 60, for comparison with the reference signal $V_{REF}'$ from the digital-to-analog converter 64. An output terminal of the comparator 60 is connected to a second input terminal of the input port 40. To determine the value of the negative peaks of the output signal $V_{OUT}$, the microcomputer 30 employs a successive approximation algorithm that rapidly changes $V_{REF}$ until the reference value equals the negative peak value. When this condition occurs, the output signal from the comparator 60 changes state, this change is recognized by the microcomputer 30, and the current reference value is then stored in the RAM 36.

A comparator 58 is also responsive to the signal $V_{OUT}$ at a first input terminal thereof. A second input terminal of the comparator 58 is connected to ground. An output terminal of the comparator 58 is connected to a third input terminal of the input port 40. The comparator 58 indicates to the microcomputer 30 if $V_{OUT}$ is greater than or less than zero. The output signal from the comparator 58 allows the microcomputer 30 to determine when a transition has occurred in the waveform of $V_{OUT}$, and if the transition is in a positive or negative direction.

The microcomputer 30 produces a correction signal $V_C$ at the output port 38. $V_C$ is supplied to a digital-to-analog converter 66 where it is converted to an analog value designated $V_C'$. The correction signal $V_C'$ is supplied as an input to the summer 11 as previously discussed. The summer 11 adds the correction signal $V_C'$ and the input information signal $V_{IN}$ such that the offset voltage in the output signal $V_{OUT}$ is removed or nulled.

The output port 38 is connected to a second input terminal of the positive peak detector 50 by a conductor 59. As will be discussed further hereinafter, it is necessary to discharge the positive peak detector 50, and this is accomplished by a signal from the output port 38 over the conductor 59 to the positive peak detector 50. The output port 38 is also connected to a second input terminal of the negative peak detector 54 via a conductor 62. When it is necessary to discharge the negative peak detector 54, a signal is supplied from the output port 38 over the conductor 62 to the negative peak detector 54 for accomplishing this.

Figure 5A:
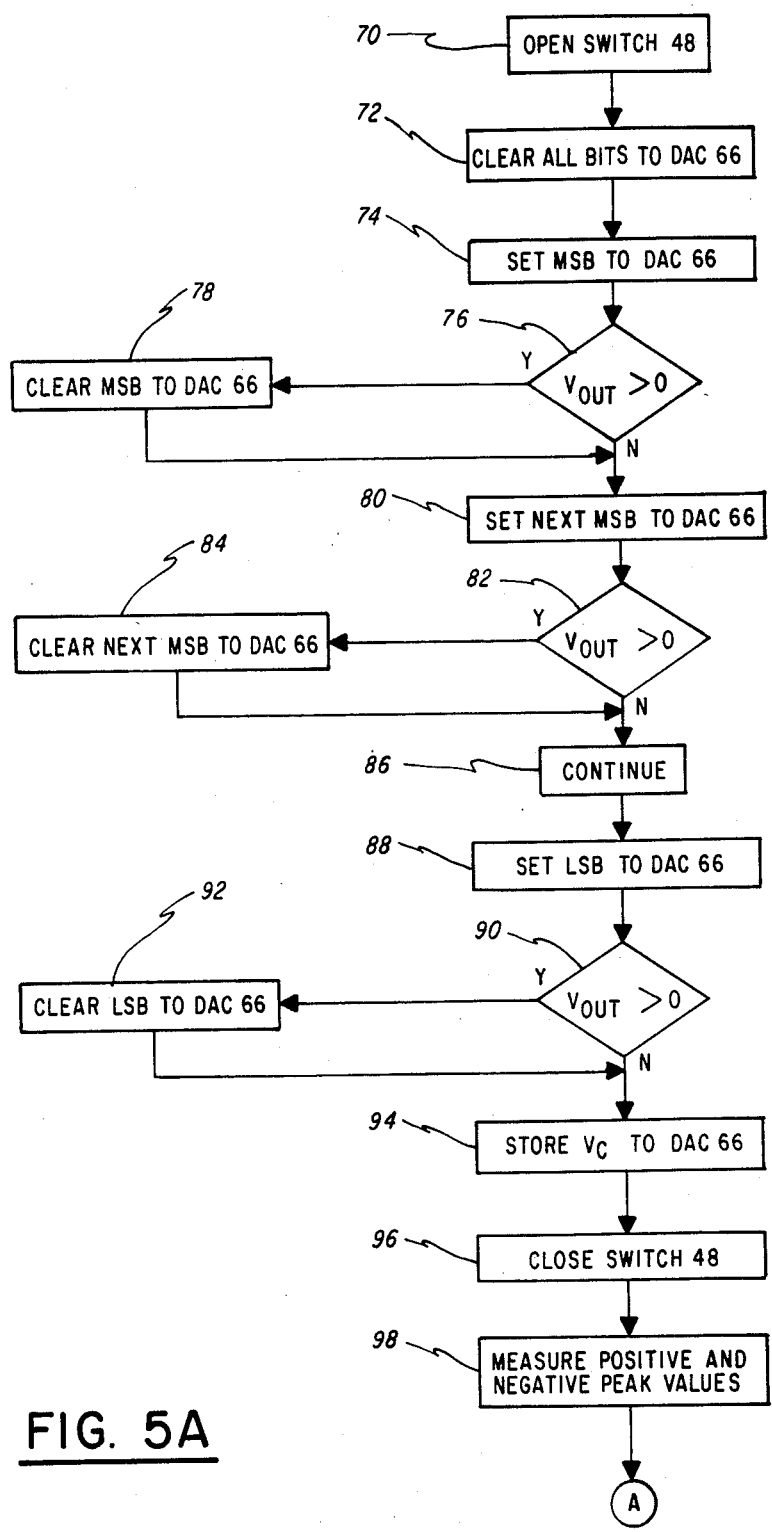
FIGS. 5A and 5B are software flow charts for controlling operation of the microprocessor of FIG. 4.
Figure 5B:
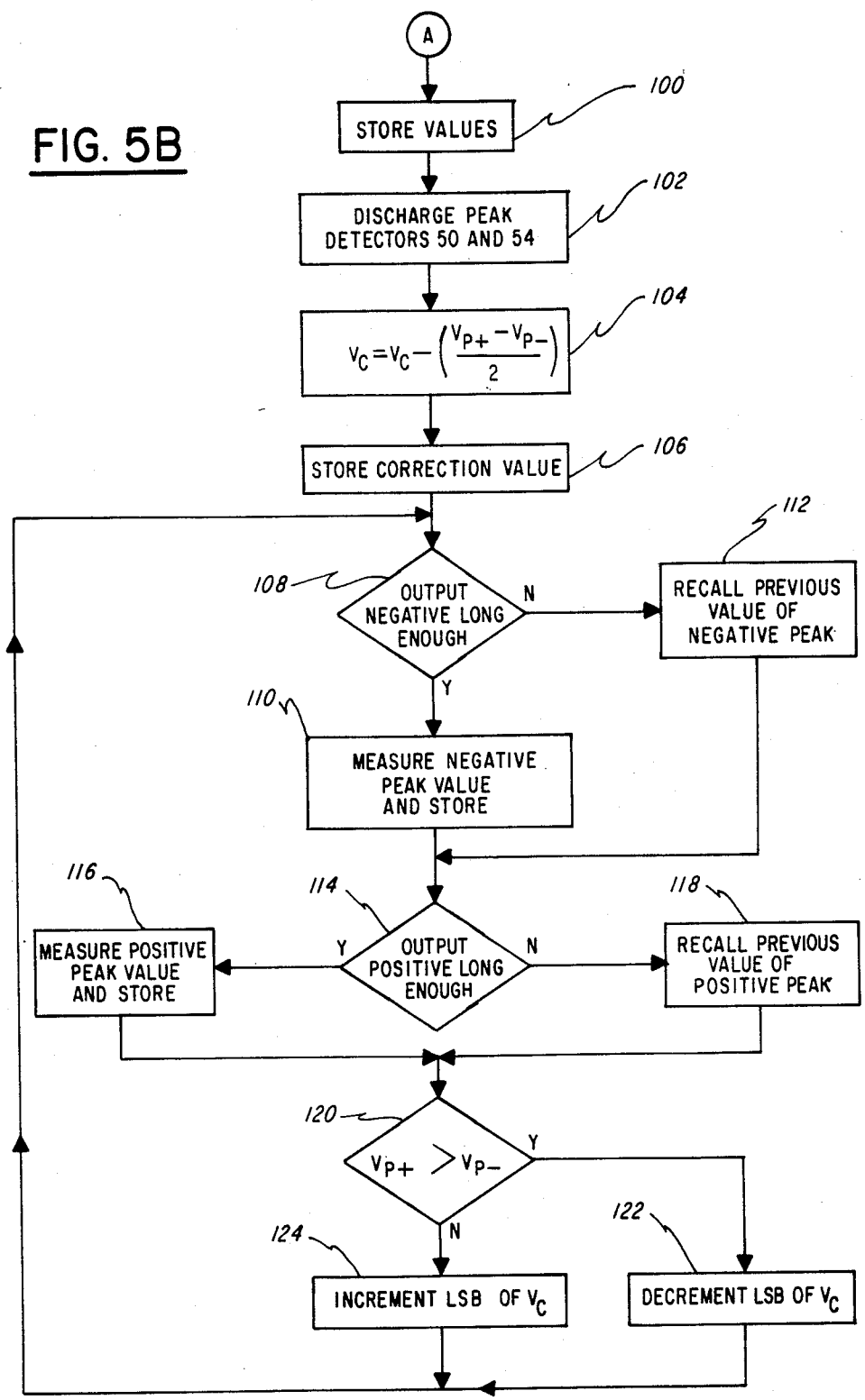

The software flow charts of FIGS. 5A and 5B illustrate one scheme for controlling the microcomputer 30 of FIG. 4 to remove the offset voltage from the input information signal $V_{IN}$. At a step 70 the switch 48 is opened. The offset compensator 10 then enters a coarse offset null stage for nulling the static component of the offset voltage. This is accomplished by a successive approximation approach whereby each bit of the correction signal $V_C$ (i.e., each bit to the digital-to-analog converter 66) is successively set then the output signal $V_{OUT}$ is checked to determine if the most recently set bit caused $V_{OUT}$ to go above zero. If this has occurred, the most recently set bit is then cleared. The coarse offset null begins at a step 72, where all bits to the digital-to-analog converter 66 (see FIG. 4) are cleared; this clears the correction signal $V_C$ to zero. At a step 74 the most significant bit to the digital-to-analog converter 66 is set, i.e., is set to a binary one value. At a decision step 76 the output signal from the comparator 58 is checked to determine whether the output signal $V_{OUT}$ is greater than zero. Processing moves to a step 78 if the response is positive, where the most significant bit of the digital-to-analog converter 66 is cleared. Processing then moves to a step 80. If the response from the decision step 76 is negative, processing bypasses the step 78 and proceeds directly to the step 80, where the next most significant bit to the digital-to-analog converter 66 is set. Processing then moves to a decision step 82 where the output signal from the comparator 58 is again checked to determine whether the output signal $V_{OUT}$ is greater than zero. If the response is positive, processing moves to a step 84 where the next most significant bit to the digital-to-analog converter 66 is cleared. After step 84 or if the response from the decision step 82 is negative, processing moves to a step 86. The step 86 represents a continuation of the process of: successively setting each remaining bit to the digital-to-analog converter 66, determining whether the output signal $V_{OUT}$ is greater than zero, clearing the most recently set bit to the digital-to-analog converter 66 if $V_{OUT}$ is greater than zero, then setting the next bit. After all the bit values, except the least significant bit, have been established, processing moves to a step 88 where the least significant bit is set. At a step 90 the output signal from the comparator 58 is checked to determine whether the output signal $V_{OUT}$ is greater than zero. If $V_{OUT}$ is greater than zero, processing moves to a step 92 where the least significant bit is cleared and processing then moves to a step 94. If $V_{OUT}$ is not greater than zero, processing moves directly to the step 94. At this point, the bits to the digital-to-analog converter 66 represent the correction signal $V_C$ that is necessary to cancel the static component of the offset voltage; this value is stored in the RAM 36, as indicated at the step 94. Further processing, to be discussed below, will modify $V_C$ to also cancel the dynamic component of the offset voltage.

At a step 96 the switch 48 is closed and the input information signal $V_{IN}$ is input to the summer 11 for summing with the correction voltage signal $V_C'$. In a preferred embodiment of the present invention the input information signal $V_{IN}$ includes a preamble portion and an information portion. Further, in the preferred embodiment the preamble portion is a symmetric square wave. At a step 98 the offset compensator 10 measures the positive peak and the negative peak values of the preamble symmetric square wave. In the preferred embodiment, the process for measuring the peak amplitudes is a successive approximation process, similar to the approach previously discussed. To measure the positive peak amplitude, the positive peak detector 50 charges to the positive peak value and provides a signal to the comparator 61 representing this peak value. See FIG. 4. $V_{REF}'$ is supplied as an input to the second input terminal of the comparator 61. If the positive peak value is greater than $V_{REF}'$ the comparator 61 remains in a low state. This is sensed by the microcomputer 30 and the reference value $V_{REF}'$ is changed by successively setting each bit of the $V_{REF}'$ then checking the output signal of comparator 61 to determine if the most recently set bit caused $V_{REF}'$ to go above the signal from the positive peak detector. After the least significant bit has been set and checked, the reference value and the positive peak value are equal. The negative peak value is measured in a similar manner using the comparator 60 and the reference signal $V_{REF}'$ from the digital-to-analog converter 64. At a step 100 the positive and negative peak values are stored, i.e., the reference values causing the comparators 60 or 61 to change state are stored. At a step 102 the positive peak detector 50 and the negative peak detector 54 are discharged by signals from the output port 38 over the conductors 59 and 62, respectively.

At a step 104 the positive and negative peak values are added and divided by two. The resulting sum is subtracted from the correction voltage $V_C'$ previously determined in the steps 70 through 92 and stored at the step 94. The resulting new correction value is stored at a step 106 and the new correction value is supplied to the summer 11 via the digital-to-analog converter 66. To this point, the microcomputer 30 has provided a coarse offset correction voltage primarily to null the static offset component and to null any offset component caused by the signal transmission path, in the later case by using the preamble of the input information signal $V_{IN}$.

When the preamble phase of the input information signal ends, the algorithm of FIGS. 5A and 5B enters a tracking mode for nulling the dynamic component of the offset voltage. At a decision step 108 the microcomputer 30 determines whether the output signal $V_{OUT}$ has been negative long enough for the negative peak detector to charge. This is accomplished by monitoring the output signal from the comparator 58, which indicates signal transitions. If the response from the decision step 108 is positive, processing moves to a step 110 where the negative peak amplitude is measured and stored. The negative peak amplitude is measured using the successive approximation approach wherein the value of $V_{REF}'$ is continuously changed until equal to the negative peak value. This technique is discussed above in conjunction with measuring the positive and negative peaks during the preamble phase of $V_{IN}$. If the result from the decision step 108 is negative, indicating that the negative peak detector did not have sufficient time to charge, the previously stored negative peak value is recalled at a step 112.

Following the step 110 or the step 112, processing moves to a decision step 114 where the microcomputer 30 determines whether the output signal has been positive long enough to charge the positive peak detector 50. This is also accomplished by monitoring the output signal from the comparator 58. If the response from the decision step 114 is positive, the positive peak is measured and stored using the successive approximation approach. If the response from the decision step 114 is negative, processing moves to a step 118 where the previous positive peak value is recalled. By way of example, and without intending to limit the scope of the present application, assume that the positive peak value is +1.0 volt and the negative peak value is −0.9 volts. If during the next update interval no negative values occur (i.e., $V_{OUT}$ is a steady positive voltage) there will not be sufficient negative voltage to charge the negative peak detector 54. Therefore, to calculate the new correction voltage, the microcomputer 30 uses the previous value of −0.9 volts and the new positive peak value during the update interval.

Returning to the flow charts of FIGS. 5A and 5B, processing moves to a step 120 following the step 116 or the step 118. At the step 120 the magnitude of the positive peak value is compared to the magnitude of the negative peak value. If the result of the decision step 120 is positive, in one embodiment the least significant bit of the correction voltage $V_C'$ (stored in the RAM 36) is incremented at a step 122. If the result of the decision step 120 is negative, the least significant bit of the correction voltage is decremented at a step 124. When added to the input information signal $V_{IN}$ at the summer 11, the correction voltage $V_C'$ removes the offset voltage in the input information signal. Following the step 122 or the step 124, processing returns to the decision step 108 for another pass through the loop, at which time the least significant bit of $V_C$ may be incremented (at the step 124) (or decremented at the step 122) to bring the magnitudes of the positive and negative peaks closer together.

Figure 6:
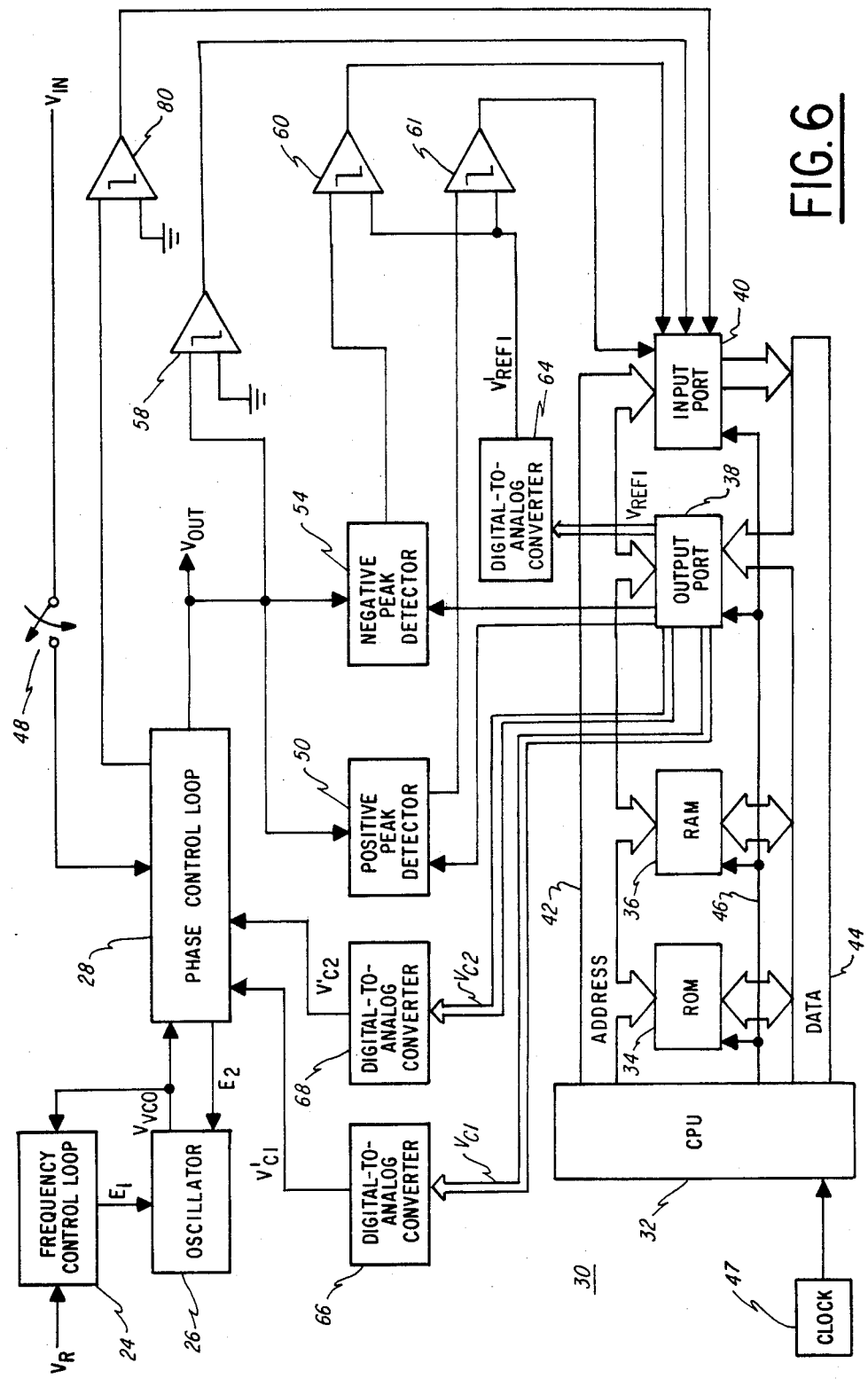
FIG. 6 is a block diagram of a third embodiment of an offset compensator constructed according to the teachings of the present invention.

FIG. 6 illustrates a demodulator 22 that is also constructed according to the teachings of the present invention to include means for removing an offset voltage from an antipodal signal. The components of FIG. 6 are identical in structure and function to the components bearing identical reference characters in FIG. 4. The demodulator 22 includes a frequency control loop 24, an oscillator 26, and a phase control loop 28, which are identical in structure and function to the frequency control loop 11, the oscillator 12, and the phase control loop 13, respectively, of co-pending and commonly assigned U.S. patent application Ser. No. 721,747, filed on even date herewith and entitled "Frequency-Agile Synchronous Demodulator." This patent application is hereby incorporated by reference, and reference should be made thereto for additional structural and operational details of the frequency control loop 24, the oscillator 26, and the phase control loop 28.

The frequency control loop 24 is responsive to a frequency reference signal $V_R$ and to a local oscillator signal $V_{VCO}$ for producing an error signal $E_1$ representative of the frequency difference between $V_R$ and $V_{VCO}$. The phase control loop 28 is responsive to a received modulated carrier signal $V_{IN}$ (modulated by an information signal) and the local oscillator signal $V_{VCO}$ for producing an error signal $E_2$ representative of the phase difference between $V_{IN}$ and $V_{VCO}$. The error signals $E_1$ and $E_2$ are input to the oscillator 26 for controlling the frequency and phase of $V_{VCO}$ to lock the frequency and phase of $V_{VCO}$ to the frequency and phase of $V_{IN}$. The phase control loop 28 also demodulates the modulated carrier signal $V_{IN}$ (in the I-channel), producing an output signal $V_{OUT}$ representative of the information signal that modulated the modulated carrier signal $V_{IN}$.

According to the inventive principles, the output signal $V_{OUT}$ (from the I or in-phase channel) is supplied as an input to the positive peak detector 50 and the negative peak detector 54. The positive peak detector 50 and the negative peak detector 54 operate with the comparators 60 and 61, and the digital-to-analog converter 64 to determine the positive and negative peak magnitudes in the I channel by the successive approximation approach discussed in conjunction with FIGS. 4, 5A, and 5B.

Further according to the inventive principles, first input terminal of a comparator 80 is responsive to the signal from the Q-channel of the phase control loop 28 (specifically, the output signal from the low-pass filter 30 of the referenced patent application). A second input terminal of the comparator 80 is connected to ground. The comparator 80 functions in a manner similar to the comparator 58, producing a signal indicating when the Q-channel signal has transitioned through zero volts.

The microcomputer 30 of FIG. 6 runs the software illustrated in FIGS. 5A and 5B for each channel to produce the correction voltage for the I channel (designated $V_{C1}$ in digital form and $V_{C1}'$ in analog form) and for the Q-channel (designated $V_{C2}$ in digital form and $V_{C2}'$ in analog form). Referring to the incorporated U.S. patent application, $V_{C1}$ from the digital-to-analog converter 66 is added to the I-channel signal. There are many well known techniques for accomplishing this, including the addition of a summer in the I-channel or adding $V_{C1}'$ to one of the stages comprising the low pass filter 34 (of the referenced patent application) in the I-channel. There are many well known techniques for adding $V_{C2}'$ to the Q-channel of the phase control loop 28 including the addition of a summer in the Q-channel or adding $V_{C2}$ to one of the stages comprising the low pass filter 30 (of the referenced patent application) in the Q-channel. When the I-channel and Q-channel correction voltages are added to the respective channels within the phase control loop 28, the offset voltage in the output signal $V_{OUT}$ is removed or nulled.

In the preferred embodiment, the software flow charts of FIGS. 5A and 5B are processed through step 96 for both the I and Q channels, but steps 98 through 124 are processed for the I channel only. The latter steps are not processed for the Q channel because, as discussed in the incorporated patent application, the Q-channel signal is nearly zero when the demodulator 22 is locked onto the received modulated carrier signal $V_{IN}$. Also, the effects of offset in the Q channel on the signal-to-noise ratio of $V_{OUT}$ are not substantial.

The discussion of the software flow charts illustrated in FIG. 5A and 5B is intended for purposes of illustration and not limitation. It is anticipated that alternative embodiments of the present invention may be conceived wherein the location of the instructions for performing the offset compensation is different from that shown in the discussed flow charts. These alternative embodiments are believed to fall within the spirit and scope of the present invention as claimed hereinafter.

Although we have shown and described an embodiment in accordance with the present invention, it is understood that the present invention is not limited thereto but is susceptible of numerous changes and modifications as known to a person skilled in the art. We, therefore, do not wish to be limited to the details shown and described herein, but intend to cover all such changes and modifications as are obvious to one of ordinary skill in the art.

What is claimed is:

1. A method for removing an offset signal from an antipodal signal, comprising the steps of:
   (a) determining the peak magnitude of the antipodal signal in the first state by successively approximating the magnitude until the approximation is within a predetermined limit of the peak magnitude;
   (b) determining the peak magnitude of the antipodal signal in the second state by successively approximating the magnitude until the approximation is within a predetermined limit of the peak magnitude;
   (c) comparing the approximation of the magnitude of the first state and the approximation of the magnitude of the second state;
   (d) producing a correction signal in response to step (c) wherein said correction signal represents the sign and magnitude difference between the approximation of the peak magnitude of the first state and the approximation of the peak magnitude of the second state; and
   (e) applying said correction signal to the antipodal signal.

2. The method of claim 1 wherein step (a) includes the steps of:
   (a1) detecting a transition of the antipodal signal to the first state; and
   (a2) determining the peak magnitude of the antipodal signal after the transition has occurred by successively approximating the magnitude until the approximation is within a predetermined limit of the peak magnitude.

3. The method of claim 1 wherein step (b) includes the steps of:
   (b1) detecting a transition of the antipodal signal to the second state; and
   (b2) determining the peak magnitude of the antipodal signal after the transition has occurred by successively approximating the magnitude until the approximation is within a predetermined limit of the peak magnitude.

4. A method for removing an offset signal from an antipodal signal, comprising the steps of:
   (a) determining the time during which the antipodal signal is in a first state;
   (b) determining if the result of step (a) exceeds a predetermined threshold;
   (c) determining the peak magnitude of the antipodal signal at the first state when said predetermined threshold of step (b) is exceeded;
   (d) determining the time during which the antipodal signal remains in a second state;
   (e) determining if the result of step (d) exceeds a predetermined threshold;
   (f) determining the peak magnitude of the antipodal signal at the second state when said predetermined threshold of step (e) is exceeded;
   (g) comparing the peak magnitude of the antipodal signal at the first state and the peak magnitude of the antipodal signal at the second state;
   (h) producing a correction signal in response to step (g) wherein said correction signal is representative of the sign and magnitude difference between the peak magnitude at the first state and the peak magnitude at the second state;
   (i) applying said correction signal to the antipodal signal.

5. The method of claim 4 including a step (j) using a previous value for the peak magnitude of the antipodal signal at the first state when the result of step (b) indicates that the time during which the antipodal signal is in the first state does not exceed the predetermined threshold.

6. The method of claim 4 including a step (k) using a previous value for the peak magnitude of the antipodal signal in the second state when the result of step (e) indicates that the time during which the antipodal signal is in the second state does not exceed the predetermined threshold.

7. A method for processing an antipodal input signal distorted by an offset signal to produce an antipodal output signal representative thereof and absent the offset voltage, said process comprising the steps of:
   (a) determining the output signal value before the input signal is received;
   (b) producing a correction signal to null the output signal value determined in step (a);
   (c) receiving the input signal;
   (d) determining the peak magnitude of the input signal in the first state by successively approximating the magnitude until the approximation is within a predetermined limit of the peak magnitude;
   (e) determining the peak magnitude of the input signal in the second state by successively approximating the magnitude until the approximation is within a predetermined limit of the peak magnitude;
   (f) comparing the approximation of the peak magnitude of the input signal at the first state and the approximation of the peak magnitude of the input signal at the second state;
   (g) producing a correction signal in response to step (f) wherein said correction signal is representative of the sign and magnitude difference between the approximation of the peak magnitude of the first state and the approximation of the peak magnitude of the second state; and
   (h) applying said correction signal to the input signal to produce the output signal.

8. The method of claim 7 wherein step (b) includes:
   (b1) producing an approximate correction signal;
   (b2) adding the correction signal to the output signal;
   (b3) determining if the output signal value is substantially equal to zero; and (b4) in response to step (b3), changing the value of said approximate correction signal until the output signal value is substantially equal to zero.

9. An offset compensator for removing an offset signal from an antipodal signal, comprising:
   means for determining the peak magnitude of the antipodal signal in the first state by successively approximating the magnitude until the approximation is within a predetermined limit of the peak magnitude;
   means for determining the peak magnitude of the antipodal signal in the second state by successively approximating the magnitude until the approximation is within a predetermined limit of the peak magnitude;
   comparator means for comparing the approximation of the magnitude of the first state and the approximation of the magnitude of the second state and for producing a comparison signal in response thereto;
   means for producing a correction signal in response to said comparison signal, wherein said correction signal represents the sign and magnitude difference between the approximation of the peak magnitude of the first state and the approximation of the peak magnitude of the second state; and
   means for applying said correction signal to the antipodal signal.

10. The offset compensator of claim 9 wherein the means for determining the peak magnitude of the antipodal signal in the first state includes:
   means for detecting a transition of the antipodal signal to the first state;
   means for determining the peak magnitude of the antipodal signal after the transition has occurred by successively approximating the magnitude until the approximation is within a predetermined limit of the peak magnitude.

11. The offset compensator of claim 9 wherein the means for determining the peak magnitude of the antipodal signal in the second state includes:
   means for detecting a transition of the antipodal signal to the second state;
   means for determining the peak magnitude of the antipodal signal after the transition has occurred by successively approximating the magnitude until the approximation is within a predetermined limit of the peak magnitude.

12. A method for demodulating a carrier signal modulated by an antipodal information signal, comprising the steps of:
   (a) providing a local oscillator signal;
   (b) producing a first signal representing the phase difference between said local oscillator signal and the modulated carrier signal, wherein said first signal controls the phase of said local oscillator signal;
   (c) mixing said local oscillator signal and the modulated carrier signal to produce a mixed signal;
   (d) filtering said mixed signal to reproduce the information signal;
   (e) determining the peak amplitudes of the information signal in the first and the second states;
   (f) comparing the peak amplitudes;
   (g) producing a correction signal in response to step (f), wherein said correction signal represents the sign and magnitude difference between the peak amplitude of the first state and the peak amplitude of the second state;
   (h) applying said correction signal to the information signal.

13. The method of claim 12 wherein the step (e) includes detecting transitions of the information signal and measuring the peak amplitude of the first state following a transition to the first state, and measuring the peak amplitude of the second state following a transition to the second state.

14. A method for demodulating a carrier signal modulated by an antipodal information signal, comprising the steps of
   (a) providing a local oscillator signal;
   (b) determining peak amplitudes of said local oscillator signal in the first and the second states;
   (c) comparing the peak amplitudes;
   (d) producing a first correction signal in response to step (c), wherein said first correction signal represents the sign and magnitude difference between the peak amplitude of the first state and the peak amplitude of the second state;
   (e) applying said first correction signal to said local oscillator signal;
   (f) receiving the modulated carrier signal;
   (g) mixing said local oscillator signal and the modulated carrier signal to reproduce the antipodal information signal;
   (h) determining the peak amplitudes of the information signal in the first and the second states;
   (i) comparing the peak amplitudes;
   (j) producing a second correction signal in response to step (i), wherein said second correction signal represents the sign and magnitude difference between the peak amplitude of the first state and the peak amplitude of the second state;
   (k) applying said second correction signal to said information signal.

15. The method of claim 14 wherein the step (b) includes detecting transitions of the local oscillator signal and determining the peak amplitude of the first state following a transition to the first state, and determining the peak amplitude of the second state following a transition to the second state.

16. The method of claim 14 wherein the step (h) includes detecting transitions of the information signal and determining the peak amplitude of the first state following a transition to the first state, and determining the peak amplitude of the second state following a transition to the second state.

17. A demodulator for demodulating a carrier signal modulated by an antipodal information signal, comprising:
   (a) means for receiving a local oscillator signal;
   (b) phase detector means for producing a first signal representing the phase difference between said local oscillator signal and the modulated carrier signal, wherein said first signal controls the phase of said local oscillator signal;
   (c) means for processing said local oscillator signal and the modulated carrier signal to reproduce the information signal;
   (d) means for determining the peak amplitudes of the information signal in the first and the second states;
   (e) comparator means for comparing the peak amplitudes;
   (f) means for producing a correction signal in response to step (e), wherein said correction signal represents the sign and magnitude difference between the peak amplitude of the first state and the peak amplitude of the second state;

(g) means for applying said correction signal to the information signal.

18. The demodulator of claim 17 wherein the means for determining the amplitudes of the information signal in the first and the second states includes means for detecting transitions of the information signal and measuring the peak amplitude of the first state following a transition to the first state, and measuring the peak amplitude of the second state following a transition to the second state.

19. A demodulator for demodulating a carrier signal modulated by an antipodal information signal comprising:

means for providing an oscillating signal;

first processor means responsive to said oscillating signal and the modulated carrier signal for producing a first signal representing the phase difference between said oscillating signal and the modulated carrier signal;

means for receiving a frequency-reference signal, having a frequency related to the frequency of the modulated carrier signal which it is desired to demodulate;

phase detector means responsive to said frequency-reference and said oscillating signals for producing a second signal representing the phase difference between said frequency-reference and said oscillating signals; and wherein said means for providing said oscillating signal is responsive to said first and second signals for controlling the frequency and phase of said oscillating signal to lock said oscillating signal to the frequency and phase of the desired modulated carrier signal;

second processor means responsive to said oscillating signal and the modulated carrier signal for reproducing the antipodal information signal;

means for determining the peak magnitude of the antipodal information signal in the first state by successively approximating the magnitude until the approximation is within a predetermined limit of the peak magnitude;

means for determining the peak magnitude of the antipodal information signal in the second state by successively approximating the magnitude until the approximation is within a predetermined limit of the peak magnitude;

comparator means for comparing the approximation of the magnitude of the first state and the approximation of the magnitude of the second state and for producing a comparison signal in response thereto;

means for producing a correction signal in response to said comparison signal, wherein said correction signal represents the sign and magnitude difference between the approximation of the peak magnitude of the first state and the approximation of the peak magnitude of the second state; and means for applying said correction signal to the antipodal information signal.

* * * * *